United States Patent
Jia et al.

(10) Patent No.: US 6,800,591 B2
(45) Date of Patent: *Oct. 5, 2004

(54) BUFFER LAYERS ON METAL ALLOY SUBSTRATES FOR SUPERCONDUCTING TAPES

(75) Inventors: Quanxi Jia, Los Alamos, NM (US); Stephen R. Foltyn, Los Alamos, NM (US); Paul N. Arendt, Los Alamos, NM (US); James R. Groves, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/242,895

(22) Filed: Sep. 11, 2002

(65) Prior Publication Data

US 2004/0018394 A1 Jan. 29, 2004

Related U.S. Application Data

(63) Continuation-in-part of application No. 10/113,476, filed on Mar. 28, 2002.

(51) Int. Cl.[7] .............. H01B 12/00; H01F 6/00; H01L 39/00
(52) U.S. Cl. .............. 505/237; 505/238; 428/701; 428/702; 428/930
(58) Field of Search ............ 428/701, 702, 428/930; 505/230, 237, 238; 174/125.1

(56) References Cited

U.S. PATENT DOCUMENTS

| 5,135,906 | A | * | 8/1992 | Harada et al. .............. 428/426 |
| 5,252,551 | A | * | 10/1993 | Wu et al. .............. 257/33 |
| 5,262,394 | A | * | 11/1993 | Wu et al. .............. 428/457 |
| 5,278,138 | A | * | 1/1994 | Ott et al. .............. 427/126.3 |
| 5,432,151 | A | * | 7/1995 | Russo et al. .............. 427/419.2 |
| 5,470,666 | A | | 11/1995 | Tanaka et al. .............. 428/653 |
| 5,545,611 | A | * | 8/1996 | Nakamura .............. 427/62 |
| 5,650,378 | A | * | 7/1997 | Iijima et al. .............. 204/192.11 |
| 5,696,392 | A | * | 12/1997 | Char et al. .............. 257/190 |
| 5,872,080 | A | * | 2/1999 | Arendt et al. .............. 428/469 |
| 6,055,446 | A | * | 4/2000 | Kroeger et al. .............. 174/125.1 |
| 6,060,433 | A | * | 5/2000 | Li et al. .............. 427/419.3 |
| 6,190,752 | B1 | | 2/2001 | Do et al. .............. 428/141 |
| 6,251,834 | B1 | * | 6/2001 | Glowacki et al. .............. 427/126.3 |
| 6,251,835 | B1 | * | 6/2001 | Chu et al. .............. 117/3 |

FOREIGN PATENT DOCUMENTS

WO WO 99/25908 * 5/1999 .......... C30B/23/02

OTHER PUBLICATIONS

Aytug et al., Growth and Characterization of Conductive $SrRuO_3$ and $LaNiO_3$ Multilayers on Textured Ni tapes for High–$J_c YBa_2Cu_3O_{7-\delta}$ Coated Conductors, J. Maater. Res., vol. 16, No. 9, pp. 2661–2669, Sep. 2001.

(List continued on next page.)

Primary Examiner—M. Alexandra Elve
Assistant Examiner—Colleen P. Cooke
(74) Attorney, Agent, or Firm—Bruce H. Cottrell

(57) ABSTRACT

An article including a substrate, at least one intermediate layer upon the surface of the substrate, a layer of an oriented cubic oxide material having a rock-salt-like structure upon the at least one intermediate layer, and a layer of a $SrRuO_3$ buffer material upon the oriented cubic oxide material layer is provided together with additional layers such as a HTS top-layer of YBCO directly upon the layer of a $SrRuO_3$ buffer material layer. With a HTS top-layer of YBCO upon at least one layer of the $SrRuO_3$ buffer material in such an article, $J_c$'s of up to $1.3 \times 10^6$ A/cm$^2$ have been demonstrated with projected $I_c$'s of over 200 Amperes across a sample 1 cm wide.

28 Claims, 10 Drawing Sheets

OTHER PUBLICATIONS

Antognazza et al., Josephson Coupling of $YBa_2Cu_3O_{7-x}$ Through a Ferromagnetic Barrier $SrRuO_3$, Appl. Phys. Lett. vol. 63, No. 7, pp. 1005–1007, Aug. 16, 1993.

Aytug et al., "Growth and Superconducting Properties of $YBa_2Cu_3O_{7-\delta}$ Films on Conductive $SrRuO_3$ and $LaNiO_3$ Multilayers for Coated Conductor Applications," Appl. Phys. Lett., vol. 76, No. 6, pp.760–762, Feb. 7, 2000.

Tiwari et al., "Epitaxial $YBa_2Cu_3O_{7-\delta}$ Thin Films on $SrRuO_3$/Pt/MgO," Appl. Phys. Lett., vol. 64, No. 5, pp. 634–636, Jan. 31, 1994.

Jia et al., "Structural and Electrical Properties of $Ba_{0.5}Sr_{0.5}TiO_3$ Thin Films with Conductive $SrRuO_3$ Bottom Electrodes," Appl. Phys. Lett., vol. 66, No. 17, pp. 2197–2199, Apr. 24, 1995.

Eom et al., "Fabrication and Properties of Epitaxial Ferroelectric Heterostructures with ($SrRuO_3$) Isotropic Metallic Oxide Electrodes," Appl. Phys. Lett., vol. 63, No. 18, Nov. 1, 1993.

Arendt et al., "High Temperature Superconducting Thick Films," S.N. 09/731,534, filed Dec. 6, 2000.

* cited by examiner

BUFFER LAYERS ON METAL ALLOY SUBSTRATES FOR SUPERCONDUCTING TAPES

RELATED APPLICATIONS

This application is a continuation-in-part of application Ser. No. 10/113,476, filed on Mar. 28, 2002, by Jia et al.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to high temperature superconducting thick films on polycrystalline substrates with high $J_c$'s and $I_c$'s and to structural template articles for subsequent deposition of an oriented film, e.g., of superconducting thick films.

BACKGROUND OF THE INVENTION

One process in the production of coated conductors (superconductive tapes or films) has been referred to as a thick film process. In the deposition of thick films for such coated conductors where the thickness of the superconductive layer is generally at least one micron in thickness, the use of polycrystalline substrates, e.g., polycrystalline metal substrates has been preferred. Buffer layers play an important role in the production of high critical current density superconducting films on polycrystalline metal substrates. Suitable buffer layers can provide the necessary structural template for subsequently deposited superconducting layers. For example, a yttria-stabilized zirconia (YSZ) buffer layer deposited by ion beam assisted deposition (IBAD) has been described by both Iijima et al., U.S. Pat. No. 5,650,378, and Russo et al., U.S. Pat. No. 5,432,151. Similarly, Arendt et al., U.S. Pat. No. 5,872,080 described a coated conductor having the structure $YBCO/Y_2O_3/YSZ/Al_2O_3/Ni$ alloy with a high critical current density ($J_c$) of about $1\times10^6$ $A/cm^2$ and a high transport critical current ($I_c$) of from about 100 to about 200 A/cm. While this current was satisfactory, the deposition of the YSZ layer was considered too slow for commercial production.

In U.S. Pat. No. 6,190,752 by Do et al., thin films of a material having a rock salt-like structure were deposited by IBAD upon amorphous substrate surfaces. Among the preferred materials with a rock salt-like structure was magnesium oxide (MgO). In comparison to the deposition of YSZ, MgO can be rapidly deposited (about 100 times faster) through an IBAD process. The structures of U.S. Pat. No. 6,190,752 included, e.g., $YBCO/Y_2O_3/YSZ/MgO/MgO$ (IBAD)/$Si_3N_4$/Ni alloy with a NiO layer in between the YSZ layer and the MgO layer in most instances. Despite the improvement in processing speeds, the structures of U.S. Pat. No. 6,190,752 had $I_c$'s of only about 50 to about 75 A/cm. In addition, at the elevated processing temperatures needed to form the superconductive layer, the silicon nitride layer reacts with other materials in the system.

In U.S. application Ser. No. 09/731,534 by Arendt et al., filed on Dec. 6, 2000, for "High Temperature Superconducting Thick Films", substrate structures were described including a layer of an inert oxide material such as aluminum oxide on the surface of the polycrystalline metallic substrate, a layer of an amorphous oxide or oxynitride material such as yttrium oxide or aluminum oxynitride on the inert oxide material layer, and, a layer of an oriented cubic oxide material having a rock-salt-like structure such as magnesium oxide upon the amorphous oxide or oxynitride material layer. One exemplary structure described in that patent application included, e.g., $YBCO/CeO_2/YSZ/MgO$ (IBAD)/$Y_2O_3/Al_2O_3$/Ni alloy. The critical current density ($J_c$) was measured as $1.4\times10^6$ $A/cm^2$ using a standard four-point measurement. The projected transport critical current ($I_c$) was 210 Amperes across a sample 1 cm wide.

The metal oxide, $SrRuO_3$, shows high chemical and thermal stability, and reasonably low electrical resistivity. Due to these properties, $SrRuO_3$ has found applications in various fields. For example, $SrRuO_3$ has been used as a bottom electrode for capacitors where ferroelectric or high dielectric constant perovskite oxides are used as dielectrics, taking advantage of the relatively low resistivity and the compatible structure of $SrRuO_3$ with the dielectric material (see, Eom et al., Appl. Phys. Lett., v. 63, pp. 2570–2572 (1993) and Jia et al., Appl. Phys. Lett., v. 66, pp. 2197–2199 (1995)). Also important was that the interface between $SrRuO_3$ and the ferroelectric materials is chemically stable since all these materials are oxides. $SrRuO_3$ has also been used in superconductor applications. For example, $SrRuO_3$ combined with platinum (Pt), can be used as a bilayer buffer to grow highly oriented superconducting YBCO on single crystal MgO substrates (Tiwari et al., Appl. Phys. Lett., v. 64, pp. 634–636 (1994)). High temperature superconductor Josephson junctions have also been fabricated using $SrRuO_3$ as a normal metal layer based on an edge-geometry superconductor/normal metal/superconductor configuration (Antognazza et al., Appl. Phys. Lett., v. 63, pp. 1005–1007 (1993)).

$SrRuO_3$ and $SrRuO_3/LaNiO_3$ have been used as a buffer layer for depositing YBCO on single crystal $LaAlO_3$ substrates (see, Aytug et al., Appl. Phys. Lett., v. 76, pp. 760–762 (2000)). Similarly, $SrRuO_3$ and $SrRuO_3/LaNiO_3$ have been used as a buffer layer for depositing YBCO on rolling-assisted biaxially textured (RABiTS) substrates (see, Aytug et al., J. Mater. Res., v. 16, no. 9, pp. 2661–2669 (2001)). The conductive oxide strontium ruthenate was specifically described as providing an electrical couple of the high temperature superconductor layer to the underlying metal substrate.

Despite the prior results of Do et al. and Arendt et al., continued improvements in the structure and resultant properties of coated conductors have been desired. After extensive and careful investigation, improvements have now been found in the preparation of superconducting films on polycrystalline substrates such as flexible polycrystalline metal substrates. In particular, strontium ruthenate ($SrRuO_3$) has now been used as a buffer layer directly on an IBAD-deposited magnesium oxide layer.

It is an object of the present invention to provide superconducting films, especially YBCO superconducting films, on polycrystalline substrates such resultant articles demonstrating properties such as high $J_c$'s and $I_c$'s.

It is another object of the present invention to provide structural template articles for subsequent deposition of oriented films, e.g., superconducting films, especially YBCO superconducting films.

SUMMARY OF THE INVENTION

To achieve the foregoing and other objects, and in accordance with the purposes of the present invention, as embodied and broadly described herein, the present invention provides an article including a substrate, one or more intermediate layers upon said substrate, a layer of an oriented cubic oxide material having a rock-salt-like structure upon the one or more intermediate layers, and a layer of $SrRuO_3$ as a buffer material upon the oriented cubic oxide material layer. In a preferred embodiment, the article is a superconductive article and further includes a top-layer of a HTS material directly upon the SrRuO$_3$ buffer layer. In other embodiments, a layer, e.g., of CeO$_2$ or SiTiO$_3$, is interposed between the HTS material and the SrRuO$_3$ buffer material. Where the article is a superconductive article, the substrate is preferably a flexible metal substrate.

In another embodiment of the invention, the present invention provides an article including a substrate, a layer of an inert oxide material upon the surface of the substrate, a layer of an amorphous oxide or oxynitride material upon the inert oxide material layer, a layer of an oriented cubic oxide material having a rock-salt-like structure upon the amorphous oxide or oxynitride material layer, and a layer of SrRuO$_3$ as a buffer material upon the oriented cubic oxide material layer. In a preferred embodiment, the article is a superconductive article and further includes a top-layer of a HTS material directly upon the SrRuO$_3$ buffer layer. In other embodiments, a layer, e.g., of CeO$_2$ or SiTiO$_3$ is interposed between the HTS material and the SrRuO$_3$ buffer material. Where the article is a superconductive article, the substrate is preferably a flexible metal substrate.

In another embodiment of the invention, the present invention provides an article including a substrate, a layer of an amorphous oxide or oxynitride material upon the substrate, a layer of an oriented cubic oxide material having a rock-salt-like structure upon the amorphous oxide or oxynitride material layer, and a layer of SrRuO$_3$ buffer material upon the oriented cubic oxide material layer. In another preferred embodiment, the article is a superconductive article and further includes a top-layer of a HTS material directly upon the SrRuO$_3$ buffer material layer. In other embodiments, a layer, e.g., of CeO$_2$ or SiTiO$_3$ is interposed between the HTS material and the SrRuO$_3$ buffer material. Where the article is a superconductive article, the substrate is preferably a flexible metal substrate.

The present invention also provides a thin film template structure including a flexible polycrystalline metal substrate, one or more intermediate layers upon said substrate, a layer of an oriented cubic oxide material having a rock-salt-like structure upon the one or more intermediate layers, and a layer of SrRuO$_3$ as a buffer layer on the layer of an oriented cubic oxide material. In one embodiment, a layer, e.g., of CeO$_2$ or SiTiO$_3$ is deposited on the SrRuO$_3$ buffer material. The thin film template structures of the present invention are useful for subsequent epitaxial growth of perovskite oxide thin films.

The present invention still further provides a thin film template structure including a flexible metal substrate a layer of an inert oxide material upon the surface of the flexible polycrystalline metal substrate, a layer of an amorphous oxide or oxynitride material upon the inert oxide material layer, a layer of an oriented cubic oxide material having a rock-salt-like structure upon the amorphous oxide or oxynitride material layer, and a layer of SrRuO$_3$ as a buffer layer on the layer of an oriented cubic oxide material. The thin film template structures of the present invention are useful for subsequent epitaxial growth of perovskite oxide thin films.

DETAILED DESCRIPTION

The present invention is concerned with high temperature superconducting wires or tapes and the use of high temperature superconducting thick films to form such wires or tapes. The present invention is further concerned with the preparation of structural template articles for the subsequent deposition of oriented films, e.g., superconducting thick films.

CeO$_2$/YSZ or Y$_2$O$_3$/YSZ buffer layers on IBAD-MgO makes the overall architecture of any resultant coated conductor too complex. Additionally, deposition of YSZ is known to be a slow process and generally requires a thick layer.

Figure 1:
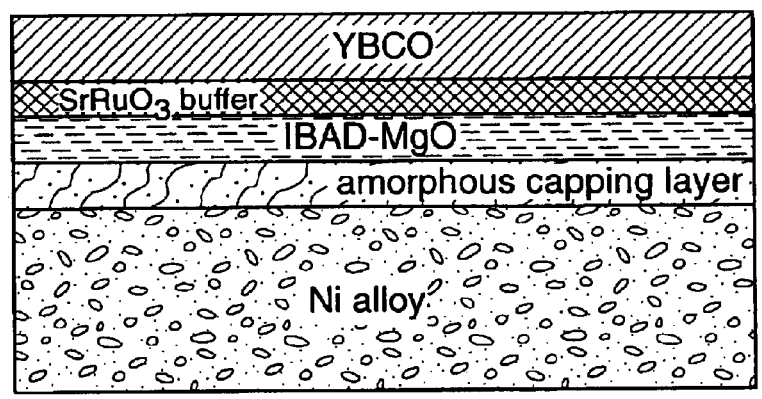
FIG. 1 shows an illustrative structure of a superconductive article in accordance with the present invention.

In the present invention, a buffer layer of SrRuO$_3$ is deposited upon the MgO layer. Then, a superconducting layer of, e.g., YBCO, can be deposited directly on the SrRuO$_3$ layer or an additional buffer layer can be deposited upon the SrRuO$_3$ layer before the superconducting layer is deposited. Such an additional buffer layer can be from materials such as CeO$_2$, Y$_2$O$_3$, other oxides such as described by Wu et al. in U.S. Pat. No. 5,262,394, SrTiO$_3$, other titanates and the like. In the preferred embodiment of the present invention, a single buffer layer of SrRuO$_3$ upon a MgO layer is used prior to deposition of a high performance superconducting film on a metal substrate. FIG. 1 shows a generic architecture of the present invention. The MgO layer is a composite layer and is formed preferably of a thin layer of IBAD-MgO with a layer of homoepitaxial MgO thereon. This MgO layer is used as a template for subsequent heteroepitaxial growth of a buffer layer of SrRuO$_3$, with this buffer layer used for subsequent heteroepitaxial growth of YBCO films. The SrRuO$_3$ layer also serves as a barrier layer to reduce interactions between the substrate and the YBCO films.

SrRuO$_3$ has an orthorhombic distorted-perovskite structure with lattice parameters of a=0.5573 nm, b=0.5538 nm, and c=0.7586 nm. It is conductive. The resistivity of the SrRuO$_3$ films is a strong function of the crystallinity of the films. Epitaxial SrRuO$_3$ films can have a room temperature resistivity of about 280 micro-ohms per centimeter.

Most commonly used buffer layer materials and architectures have disadvantages. The present invention using SrRuO$_3$ exhibits the following advantages over existing technology. First, the single buffer layer simplifies the processing. Next, the high deposition rate possible with SrRuO$_3$ minimizes the processing time. The good structural and chemical compatibility of SrRuO$_3$ with MgO makes epitaxial growth of the buffer layer easier. The smooth surface morphology of SrRuO$_3$ improves the coverage of the deposited materials. Especially useful is that the high chemical stability of $SrRuO_3$ makes it a more stable buffer material for subsequent deposition of YBCO where chemical processing is preferred (see Feenstra et al., J. Appl. Phys., v. 69, p. 6569 (1991) and Smith et al., IEEE Trans. Appl. Supercond., v. 9, p. 1531 (1999). High critical current density YBCO films can be achieved by using the buffer material of $SrRuO_3$; and, texture of the resultant article is enhanced. Additionally, the $SrRuO_3$ can be replaced by $(Sr_{1-x}Ca_x)RuO_3$ where ($1 \leq x \leq 0$).

The $SrRuO_3$ buffer material used in the present invention is especially useful in coated conductors where biaxially oriented MgO is used as a template. The biaxially oriented MgO is deposited upon the top layer of one or more intermediate layers on a base substrate. The base substrate is preferably a flexible polycrystalline metal substrate for superconductive applications. Such a base substrate with the one or more intermediate layers thereon can be generally referred to as a "buffered substrate" and a metal substrate with the one or more intermediate layers thereon can be generally referred to as a "buffered metal substrate".

Figure 2:
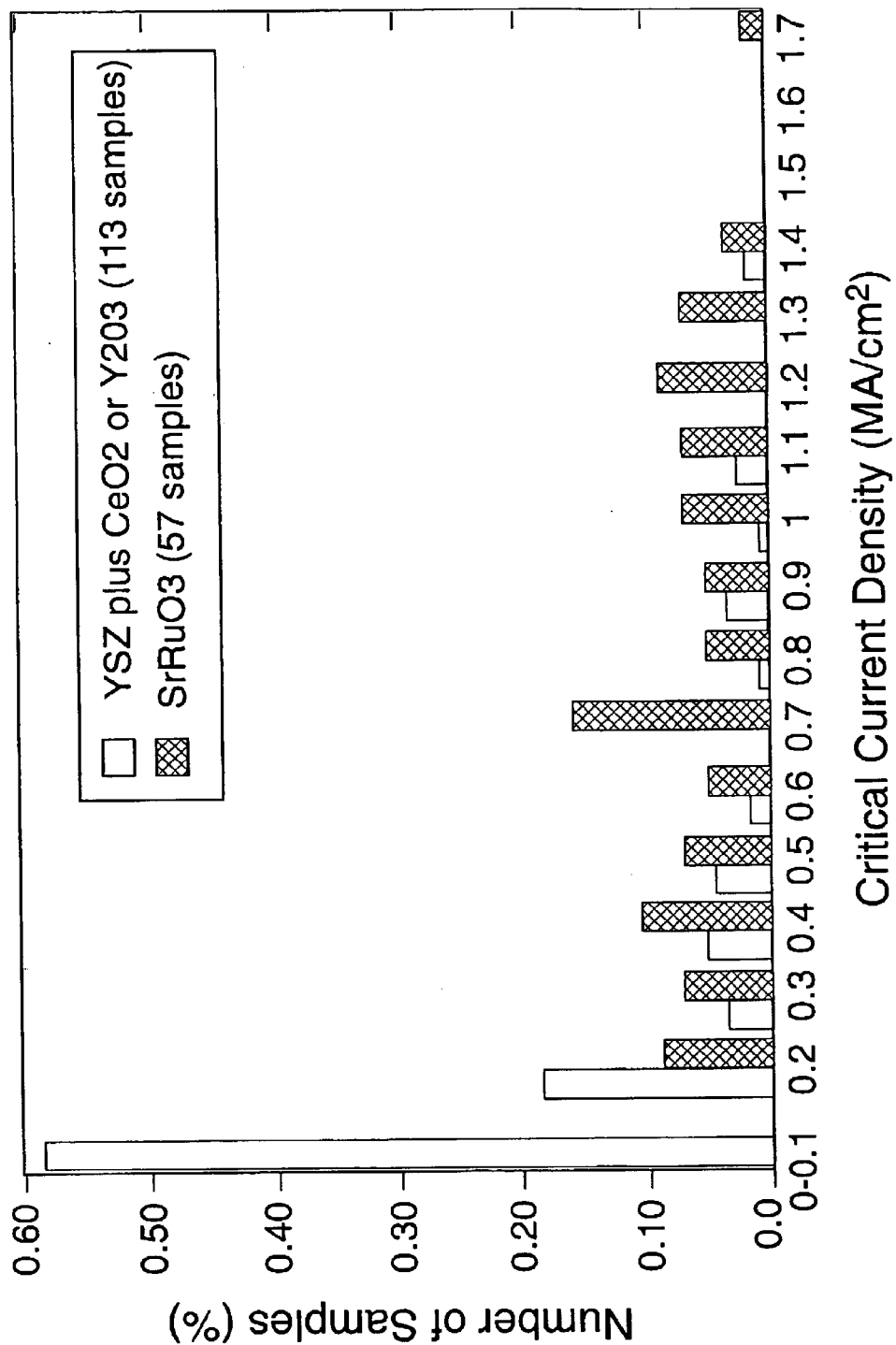
FIG. 2 shows a plot of a percentage of a number of samples having a corresponding critical current density in testing of over 150 different samples.

The growth of high performance YBCO films on polycrystalline Ni-alloy substrates using $SrRuO_3$ as a buffer layer has been successfully demonstrated where IBAD-MgO is used as a template on the buffered metal substrate. The results plotted in FIG. 2 show the superconducting properties of numerous superconducting films (each a YBCO layer of about 1 micron), where the IBAD-MgO was deposited by the standard processing conditions of U.S. Pat. No. 5,470,668 followed by deposition of homoepitaxial MgO. The $SrRuO_3$ layer was deposited by pulsed laser deposition at a substrate temperature of 775° C. and an oxygen pressure of 200 mTorr. The repetition rate of the laser was 5 Hz. The superconducting films were deposited by pulsed laser deposition using the same conditions as used for the deposition of the $SrRuO_3$ buffer layer except for the repetition rate of 10 Hz. FIG. 2 compares these results to samples using IBAD-YSZ also deposited by the standard processing conditions of U.S. Pat. No. 5,470,668 on a buffered metal substrate and including buffer layers of $CeO_2$ or $Y_2O_3$ upon the YSZ.

For additional comparison purposes, YBCO films have been deposited on a Ni-based alloy using IBAD-MgO as a template on the buffered metal substrate and a single layer of $SrTiO_3$ as a buffer. The $SrTiO_3$ was deposited at the same conditions as the $SrRuO_3$ except that a repetition rate of 10 Hz was used for the $SrTiO_3$ deposition. The YBCO film on a $SrRuO_3$ buffered MgO template had a critical current density ($J_c$) over 1.2 $MA/cm^2$ but only a $J_c$ of 0.33 $MA/cm^2$ was achieved for a similar YBCO film on the $SrTiO_3$ buffered MgO template. This implies that the $SrTiO_3$ buffer deposited under these conditions is either not thick enough (not an effective barrier) or the deposition rate is lower compared with the $SrRuO_3$ sample. It should be noted that good quality YBCO films (critical current density over 1 $MA/cm^2$) have been obtained on Ni-based alloy substrates using IBAD-MgO as a template and single layer $SrTiO_3$ as a buffer. In this case, relatively thicker $SrTiO_3$ buffer layers were used (e.g., the $SrTiO_3$ buffer layers were deposited at a repetition rate of 20 Hz and 20 minutes.

The $SrRuO_3$ films deposited under our standard conditions on homoepitaxial MgO/IBAD-MgO upon buffered metal substrates were quite smooth. An average RMS of from about 2.4 to about 3.1 nm was typical for a scan area across 4 by 4 micron. As a comparison, the average RMS for the IBAD-MgO on a buffered metal substrate was around 1.0 nm across the same scan area.

Figure 3:
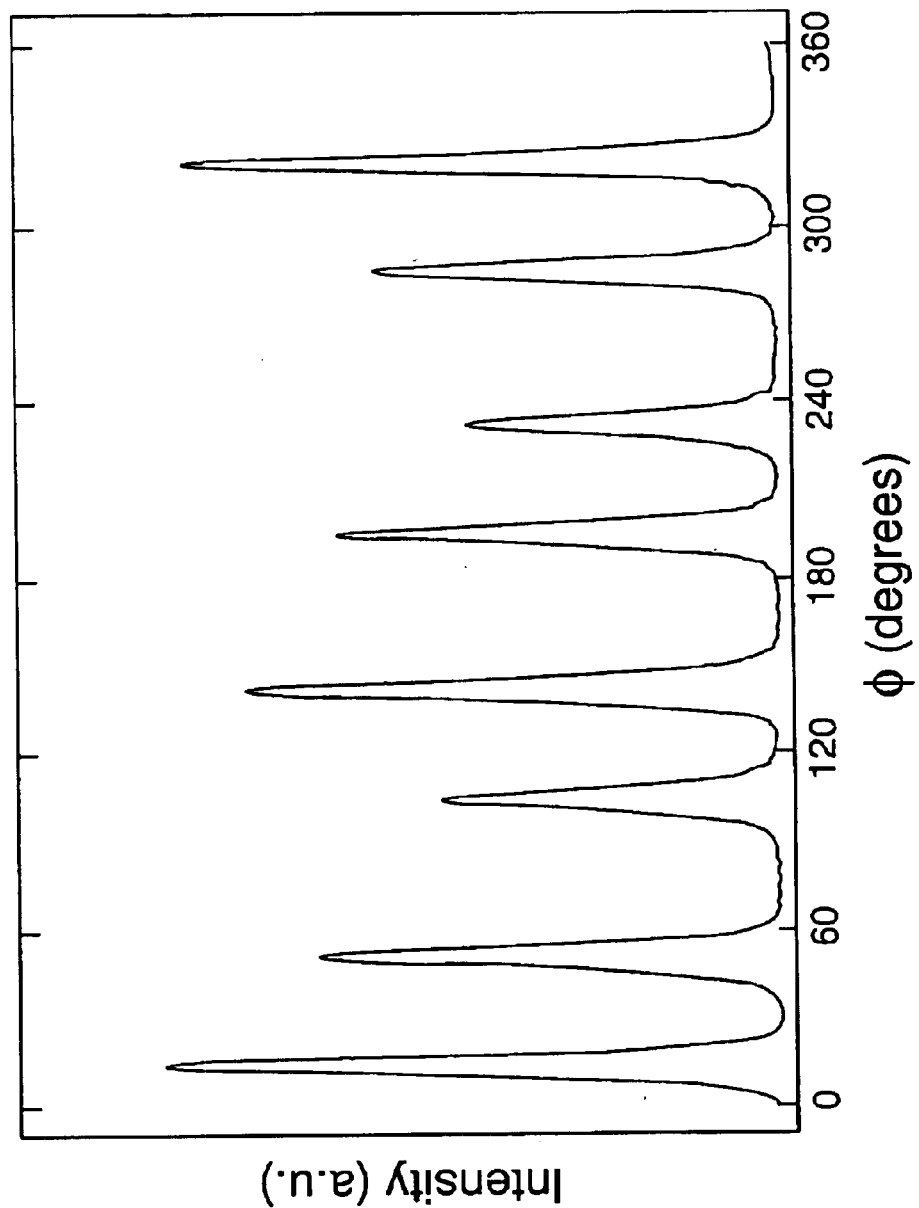
FIG. 3 shows the x-ray φ-scan of SrRuO$_3$ (132) diffraction for a SrRuO$_3$ buffer on a homoepitaxial MgO/IBAD-MgO on Ni-alloy.

The x-ray 2θ-scan showed the $SrRuO_3$ film deposited under the above described conditions on homoepitaxial MgO/IBAD-MgO on a buffered nickel alloy was (001)-oriented. FIG. 3 shows the x-ray phi-scan of $SrRuO_3$ (132) diffraction for a $SrRuO_3$ buffer on homoepitaxial MgO/IBAD-MgO on a buffered Ni-alloy. The value of the full width at half maximum (FWHM) of (132) diffraction peak was in the range of 4.3 degrees to 6 degrees.

Figure 4:
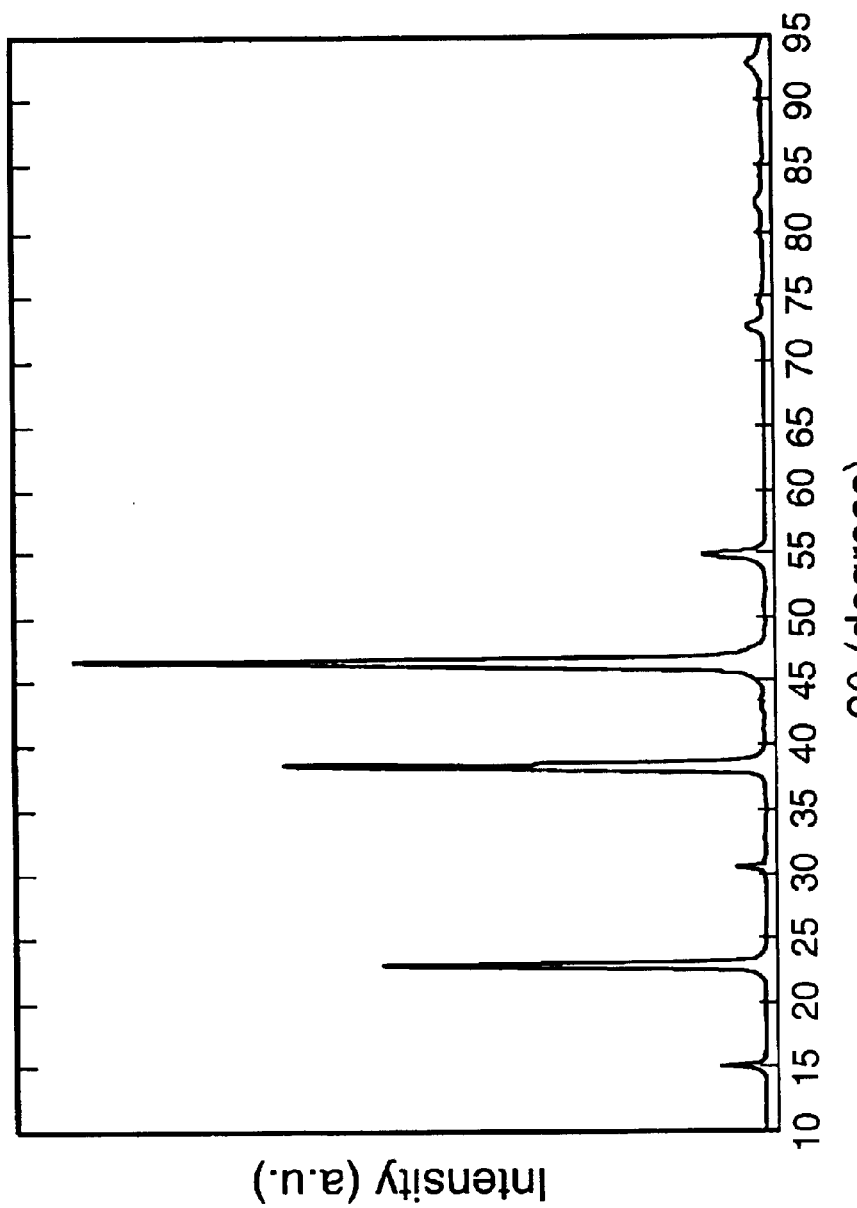
FIG. 4 shows the x-ray normal 2θ-scan of the superconducting film on SrRuO$_3$/homoepitaxial MgO/IBAD-MgO buffered Ni-alloy.
Figure 5:
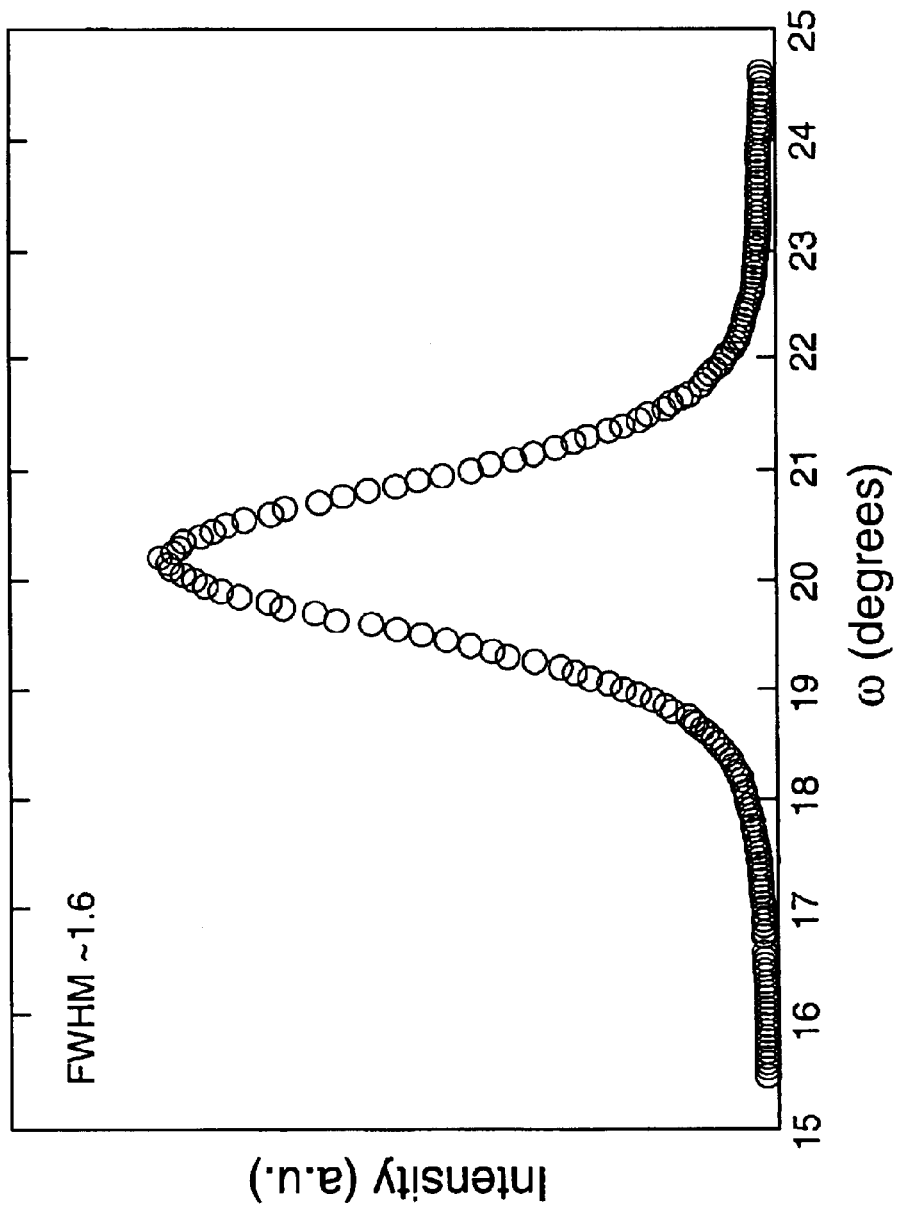
FIG. 5 shows the x-ray ω-rocking curve on the YBCO (005) diffraction of the superconducting film on the SrRuO$_3$/homoepitaxial MgO/IBAD-MgO buffered Ni-alloy.

The superconducting films deposited upon a $SrRuO_3$/homoepitaxial MgO/IBAD-MgO/buffered Ni-alloy were c-axis oriented. FIG. 4 shows the x-ray normal 2θ-scan of the superconducting film on $SrRuO_3$/homoepitaxial MgO/IBAD-MgO/buffered Ni-alloy. The x-ray omega-rocking curve on the YBCO (005) diffraction of the superconducting film on the $SrRuO_3$/homoepitaxial MgO/IBAD-MgO/buffered Ni-alloy is shown in FIG. 5. The value of the FWHM from rocking curve was 1.6 degrees.

Figure 6:
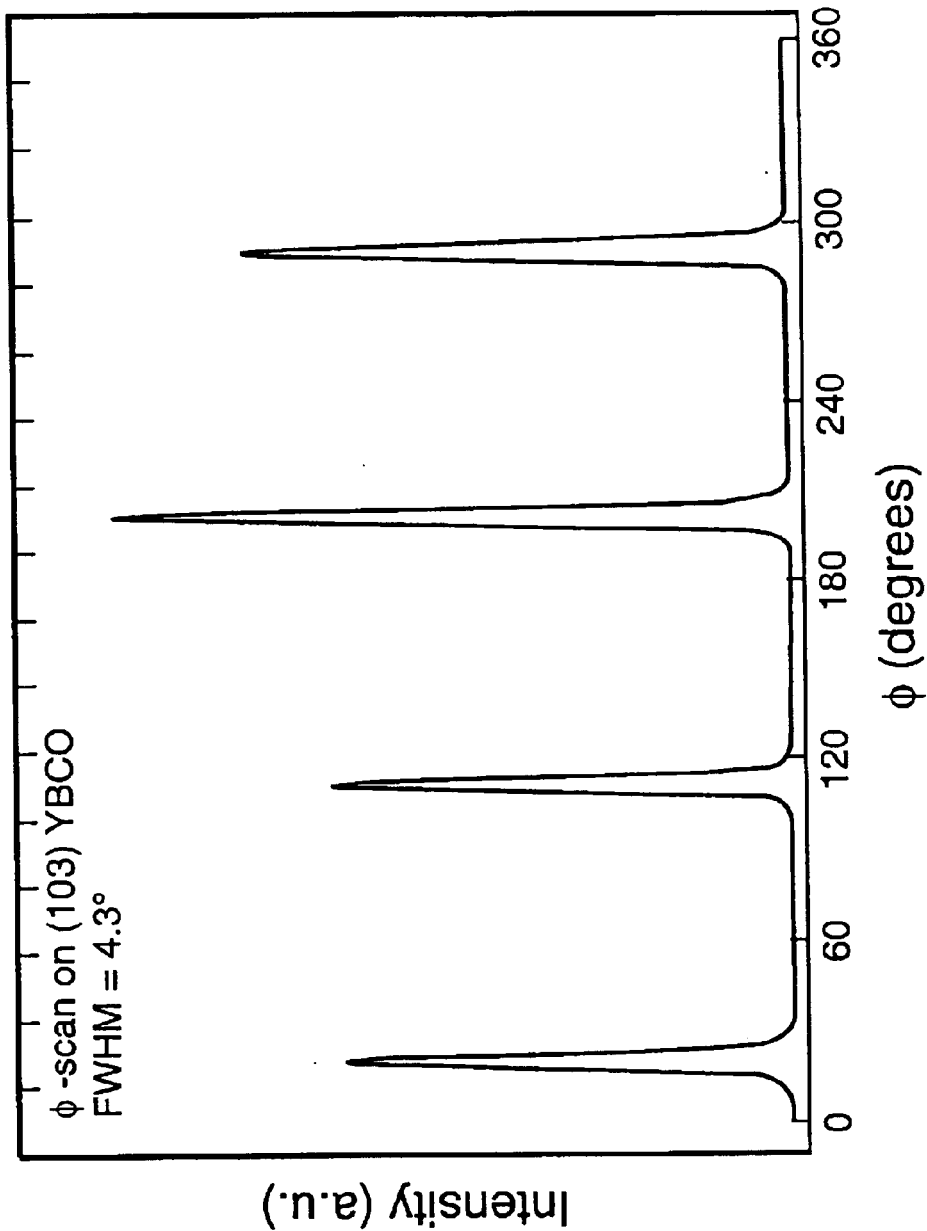
FIG. 6 shows the x-ray φ-scan on the YBCO (103) diffraction for a YBCO film on a SrRuO$_3$/homoepitaxial MgO/IBAD-MgO buffered Ni-alloy.

The superconducting films on $SrRuO_3$/homoepitaxial MgO/IBAD-MgO/buffered Ni-alloy were aligned in-plane. FIG. 6 shows the x-ray phi-scan on the YBCO (103) diffraction for a YBCO film on $SrRuO_3$/homoepitaxial MgO/IBAD-MgO/buffered Ni-alloy. The value of the FWHM of the (103) diffraction peak was between 4.3 degrees.

Figure 7:
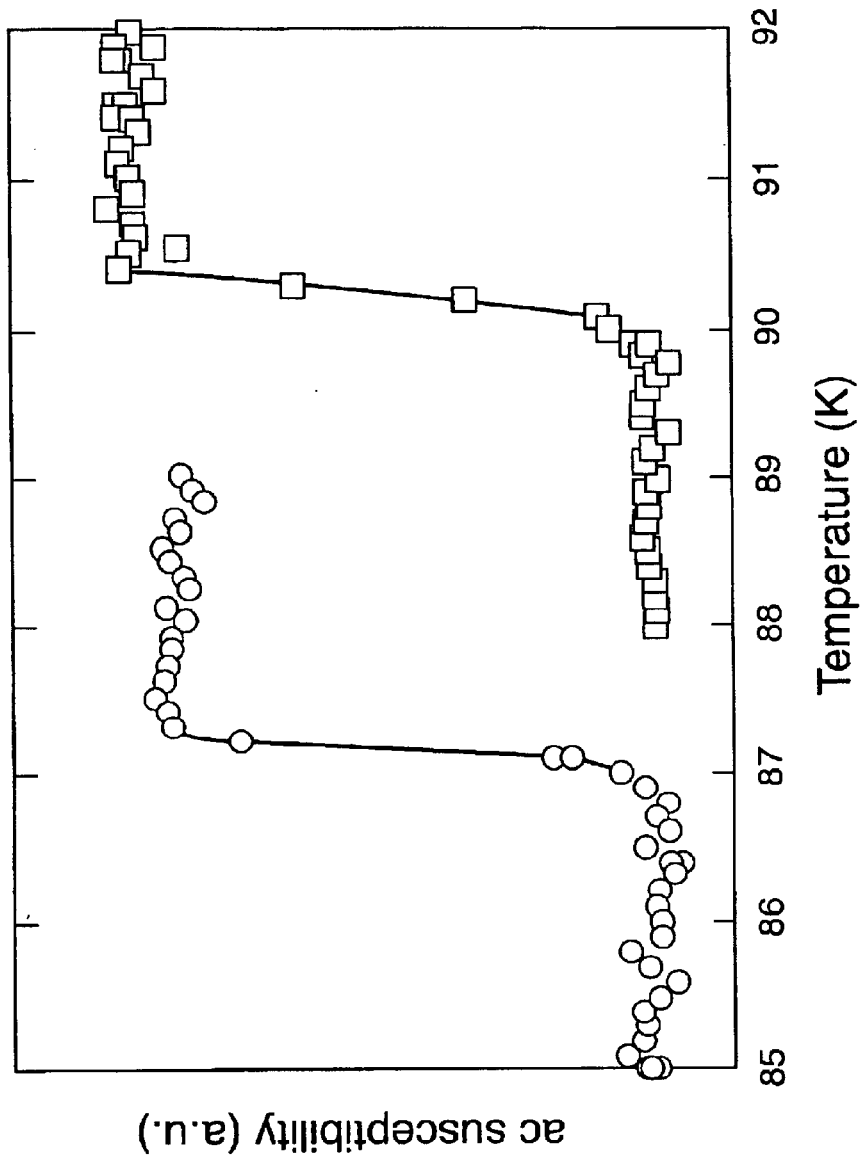
FIG. 7 shows the ac susceptibility test result for a superconducting film on a SrRuO$_3$/homoepitaxial MgO/IBAD-MgO buffered Ni-alloy substrate.
Figure 8:
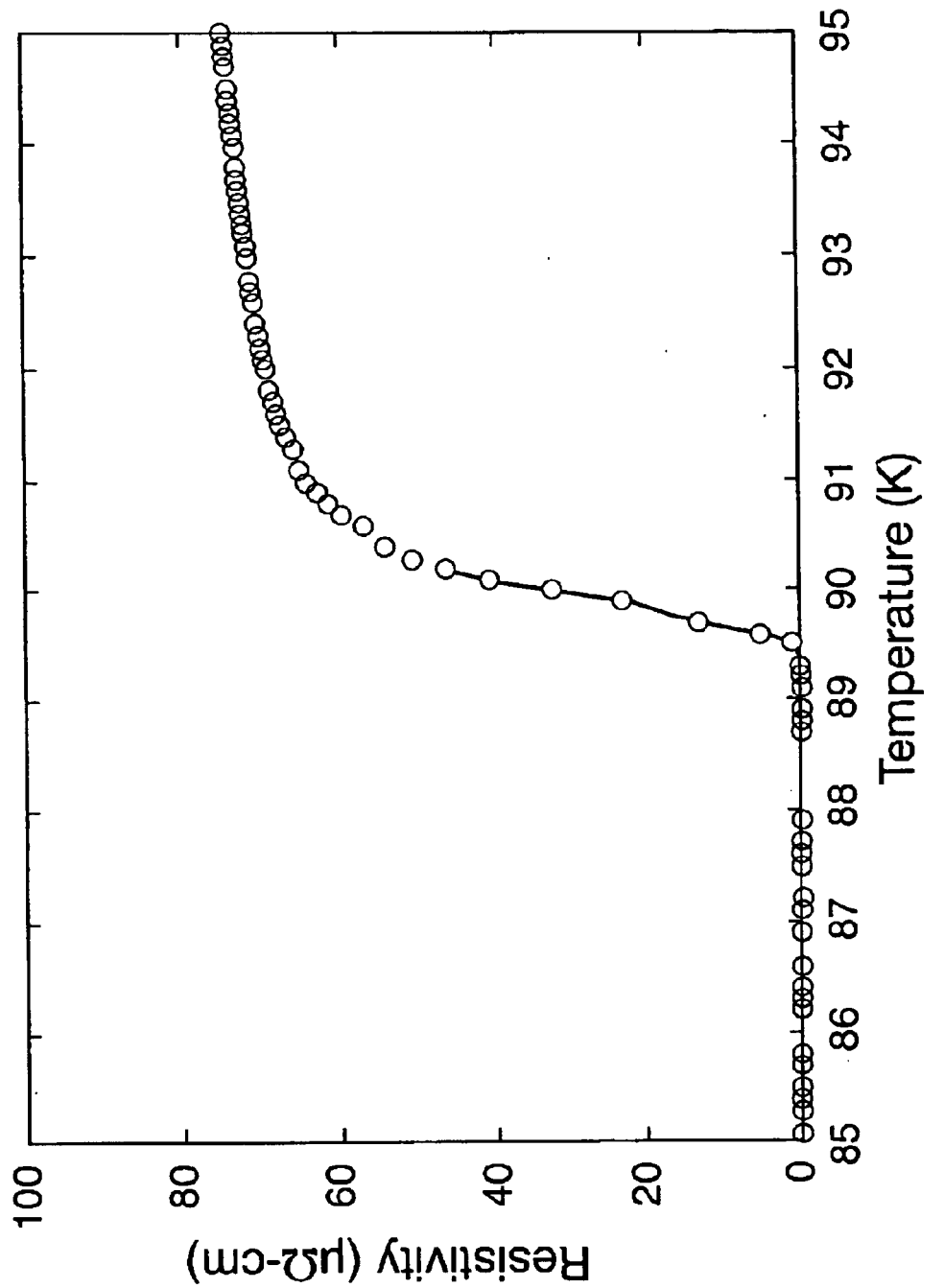
FIG. 8 shows the resistivity versus temperature characteristic of a superconducting film on SrRuO$_3$/homoepitaxial MgO/IBAD-MgO buffered Ni-alloy substrates.

The superconducting films on $SrRuO_3$/homoepitaxial MgO/IBAD-MgO/buffered Ni-alloy usually exhibited slightly higher transition temperatures in comparison with the films made using conventional buffer structures. FIG. 7 shows the ac susceptibility test result for two superconducting films on $SrRuO_3$/IBAD-MgO/buffered Ni-alloy substrates. The transition temperature of the superconducting films was higher than 87 K with a transition in the range of 0.2 to 0.6 degrees. This relatively higher transition temperature was also confirmed by transport measurements. FIG. 8 shows the resistivity versus temperature characteristic of a superconducting film on $SrRuO_3$/homoepitaxial MgO/IBAD-MgO/buffered Ni-alloy substrates.

Figure 9:
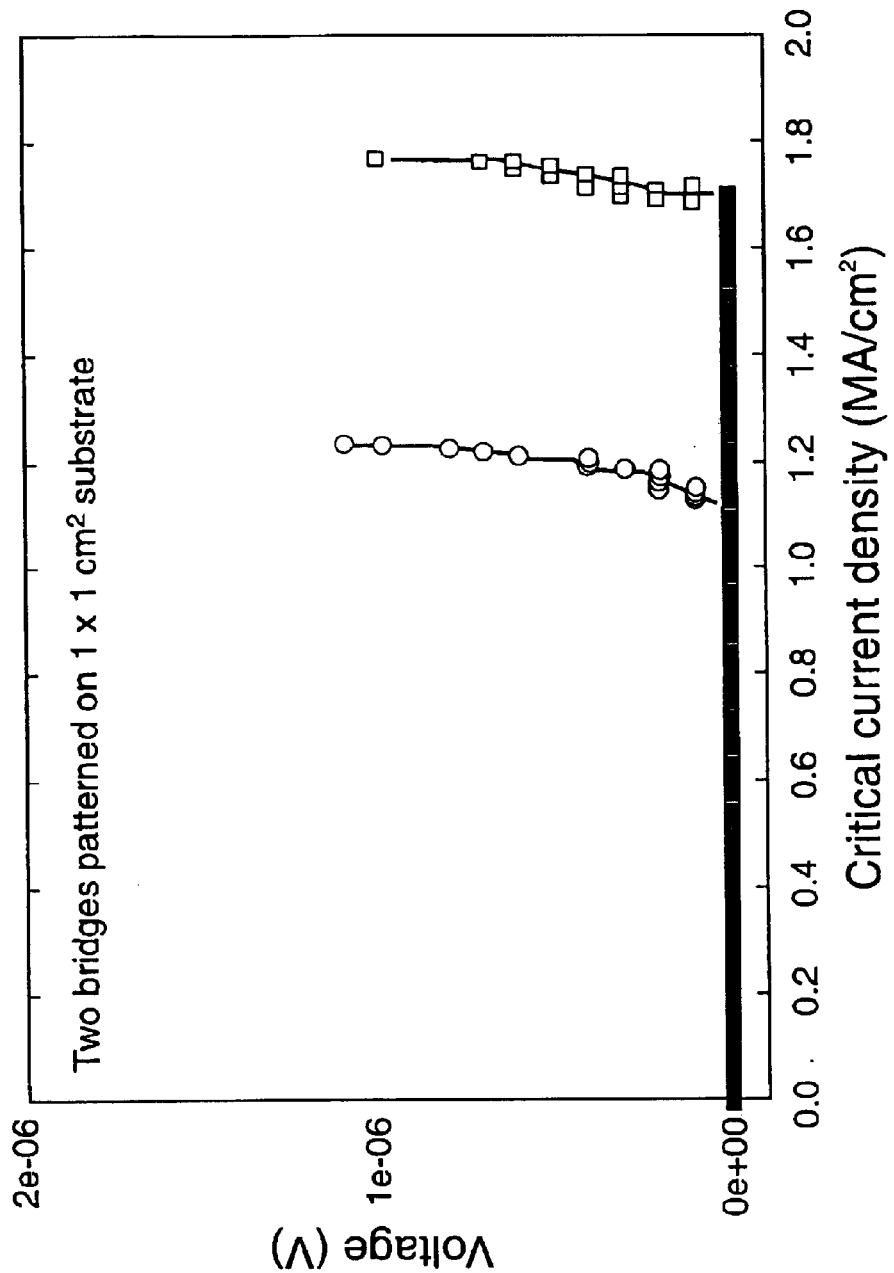
FIG. 9 shows the critical current density of a superconducting film on a SrRuO$_3$/homoepitaxial MgO/IBAD-MgO buffered Ni-alloy, where two bridges were patterned on a 1 by 1 cm$^2$ substrate.
Figure 10:
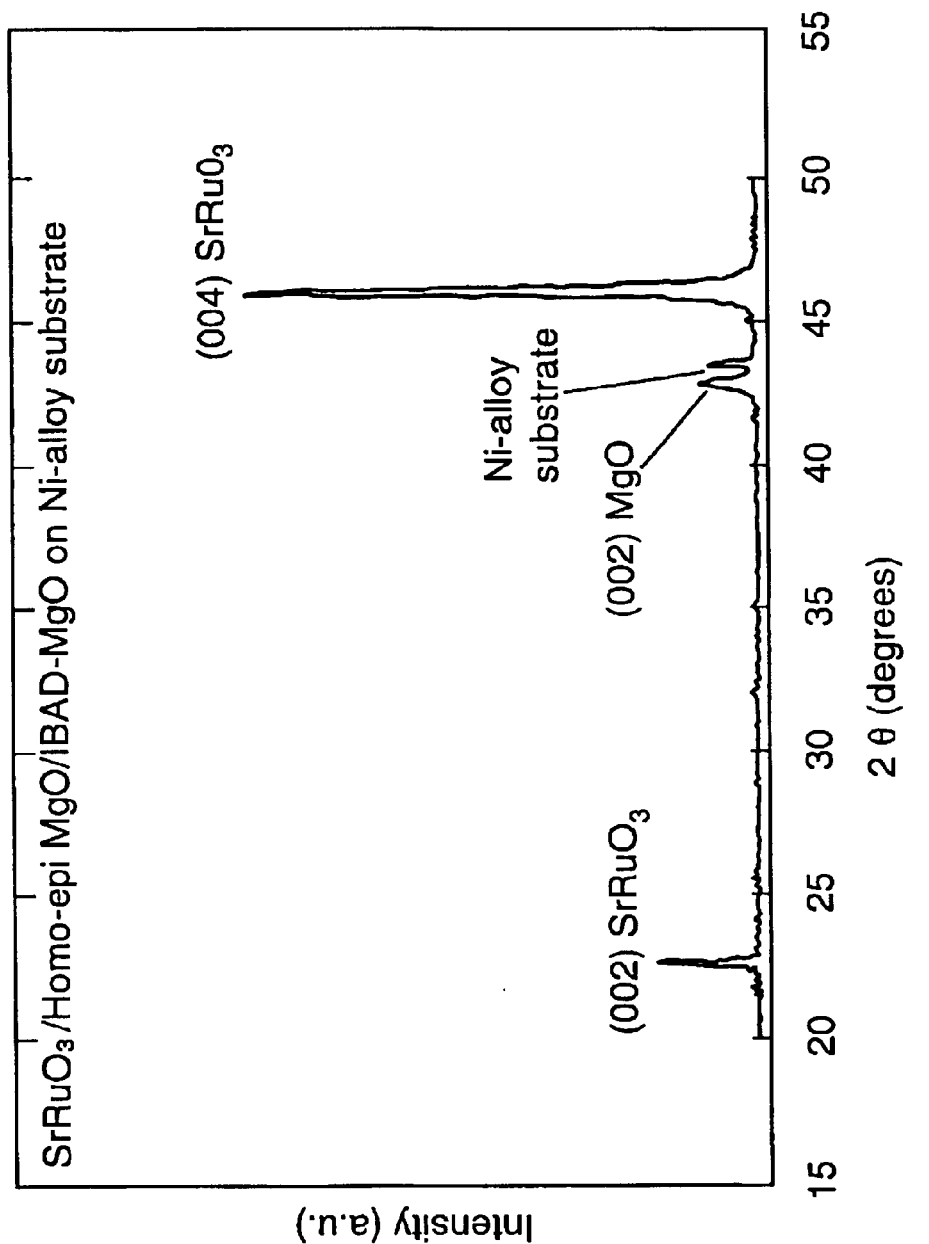
FIG. 10 shows the x-ray normal 2θ-scan of the SrRuO$_3$ film on IBAD-MgO buffered Ni-alloy.

The most important accomplishment using $SrRuO_3$ as a buffer for deposition of superconducting films on IBAD-MgO metal substrates is the reproducible high critical current density. FIG. 9 shows the critical current density of a superconducting film on $SrRuO_3$/homoepitaxial MgO/IBAD-MgO/buffered Ni-alloy, where two bridges were patterned on a 1 by 1 $cm^2$ substrate. A critical current density of 1.74 $MA/cm^2$ at 75.2 K has been achieved for a superconducting film with a thickness of 1.35 micrometers.

In addition to the use of $SrRuO_3$ as a buffer layer between a superconductive layer of YBCO and an IBAD-MgO layer upon a buffered nickel-alloy substrate, $SrRuO_3$ can also be used as a buffer layer upon an IBAD-YSZ template layer upon a nickel-alloy substrate and can be used directly upon a nickel-alloy substrate having a cerium oxide seed layer.

$SrRuO_3$ is highly resistant to chemical attack in comparison to other oxides such as cerium oxide ($CeO_2$), strontium titanate ($SrTiO_3$) and nickel oxide (NiO). By using $SrRuO_3$ as a buffer layer, the resultant material can be highly stable in environmentally challenging conditions. For example, hydrofluoric acid (HF) can be generated during the growth of YBCO films using a trifluoroacetate (TFA) process (see, e.g., McIntyre et al., J. Appl. Phys., v. 77, pp. 5263–5272 (1995)) and/or a barium fluoride ($BaF_2$) process (see Smith et al., IEEE Trans. Appl. Supercond., v. 9, pp. 1531–1534 (1999)). By using conventional oxides as the buffer layer, the HF can destroy the buffer material due to the chemical reaction between HF and such conventional oxides. Nevertheless, HF does not attack $SrRuO_3$ films.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals such as, e.g., erbium, samarium, neodymium, europium, gadolinium, holmium, ytterbium, or dysprosium, as a substitute for some or all of the yttrium as is well known, may also be used. Other superconducting materials such as bismuth and thallium based superconductor materials may also be employed. $YBa_2Cu_3O_{7-\delta}$ is preferred as the superconducting material. In addition, mixtures of superconducting materials may be used and multilayers of the same or differing superconducting materials may be used.

In the present invention, the initial or base substrate can be, e.g., any polycrystalline material such as a metal or a ceramic such as polycrystalline aluminum oxide or polycrystalline yttria-stabilized zirconia (YSZ). Preferably, the substrate can be a polycrystalline metal such as a nickel alloy. Suitable nickel alloys can include nickel alloys such as various Hastelloy metals, Haynes metals and Inconel metals. The base substrate may also be a textured metal or metal alloy, e.g., pure nickel, copper, nickel alloy or copper alloy as described by Goyal et al. in U.S. Pat. No. 5,741,377 Substrates from such a textured metal process are generally referred to as rolling assisted biaxially textured substrates (RABiTS). The metal substrate on which the superconducting material is eventually deposited should preferably allow for the resultant article to be flexible whereby superconducting articles (e.g., coils, motors or magnets) can be shaped. As such a metal substrate can have a rough surface, it can be mechanically polished, electrochemically polished or chemically mechanically polished to provide a smoother surface. Alternatively, the desired smoothness for subsequent depositions can be provided by the first coating layer, i.e., an inert oxide material layer.

Whether the metal substrate is polished or not, a layer of an inert oxide material can be deposited upon the base substrate. By "inert" is meant that this oxide material does not react with the base substrate or with any subsequently deposited materials. Examples of suitable inert oxide materials include aluminum oxide ($Al_2O_3$), erbium oxide ($Er_2O_3$), yttrium oxide ($Y_2O_3$), and yttria-stabilized zirconia (YSZ). The inert oxide layer can be deposited on the base substrate by pulsed laser deposition, e-beam evaporation, sputtering or by any other suitable means. The layer is deposited at temperatures of generally greater than about 400° C. When the base substrate is metallic, it often has a rough surface with, e.g., a RMS of 15 nm to 100 nm or greater. Generally, the inert oxide layer has a thickness of from about 100 nanometers (nm) to about 1000 nm depending upon the roughness of the base substrate with a thicker coating layer for rougher base substrate surfaces. The inert oxide layer serves to provide a smooth surface for subsequent depositions. By "smooth" is meant a surface having a root mean square (RMS) roughness of less than about 2 nm, preferably less than about 1 nm. To obtain the desired smoothness, it can be preferred to treat the deposited inert oxide layer by chemical mechanical polishing. Where the initial metal substrate has a sufficient smoothness, polishing of the inert oxide is generally unnecessary. In the case of erbium oxide, the inert oxide material can also serve as a nucleation layer for subsequent layers.

Alternatively, when using aluminum-containing metal substrates a layer of aluminum oxide can be directly formed in situ. Using aluminum-containing metal substrates with less than about 30 atomic percent aluminum has generally required a heat treatment of the metal substrate to form the aluminum oxide layer, while with aluminum-containing metal substrates containing greater than about 30 atomic percent aluminum, an intermediate aluminum oxide layer is achieved without any required heat treatment other than that achieved during normal deposition processing. Heat treatment of the aluminum-containing metal substrate generally involves heating at from about 800° C. to about 1000° C. in an oxygen atmosphere.

In one embodiment, substrates are prepared as intermediate articles for subsequent IBAD MgO overcoatings by the following. If the as received metal alloy starts out with a RMS roughness of less than about 15 nm, the metal substrate can be chemically mechanically polished (CMP) to a RMS roughness of about 1.5 nm. (Note: For measuring roughness, all scans are done using scanning force microscopy and are over a 5×5 $\mu m^2$ area.) The time needed to do this is approximately 2 minutes. The polishing slurry used is commercially available colloidal silica (e.g., Mastermet 2, 0.02 $\mu m$ non-crystallizing colloidal silica suspension, available from Buehler, Ltd., Lake Bluff, Ill.). If the initial metal substrate is much rougher (e.g., a RMS roughness of greater than about 15 nm), then the metal substrate is generally mechanically polished with a 1 micron or finer diamond paste for a short time period of from about 10 seconds to about 20 seconds to get the finish to about 4 mn to about 6 nm followed by a 2 minute CMP with silica as previously described. Preferably, the metal substrate starts out with a minimum of inclusions (less than about 5 inclusions per 5×5 $\mu m^2$ area). Inclusions are usually harder than the surrounding metal matrix and generally appear as bumps or holes (where the polishing plucks them out of the metal matrix) in surface profile scans.

In one embodiment, a layer of an amorphous oxide or oxynitride material can be next deposited upon the inert oxide material layer. The amorphous oxide or oxynitride layer can serve as a nucleation layer for oriented growth of subsequent layers. The amorphous oxide or oxynitride layer can be deposited on the base substrate by pulsed laser deposition, e-beam evaporation, sputtering or by any other suitable means. The layer is generally deposited at temperatures of generally about 100° C. The amorphous oxide or oxynitride layer is typically from about 5 nm to about 100 nm in thickness, preferably from about 20 nm to about 40 nm. Among the oxide or oxynitride materials suitable as the amorphous layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate ($NiAl_2O_4$), and barium zirconate ($BaZrO_3$). Preferably, the layer of oxide or oxynitride amorphous material is yttrium oxide, aluminum oxynitride, erbium oxide or yttria-stabilized zirconia and more preferably is yttrium oxide or erbium oxide. For the very best surface finishes with a RMS roughness of less than about 1 nm, after the smooth or polished metal alloy is overcoated with the inert oxide film, a short (e.g., about 5 seconds) CMP step can be conducted. In another embodiment, a single layer of erbium oxide can be used to provide both the smoothness and the nucleation layer. Such a layer can be chemically mechanically polished if desired.

In another embodiment, the base substrate, e.g., a flexible polycrystalline metallic substrate, can include an intermediate layer of a material such as $Si_3N_4$ as described by Do et al. in U.S. Pat. No. 6,190,752 to form an intermediate article.

Such intermediate articles provide an excellent substrate for the subsequent deposition of a layer of an oriented cubic oxide material having a rock-salt-like structure. Such oriented cubic oxide materials can be, e.g., magnesium oxide, calcium oxide, strontium oxide, zirconium oxide, barium oxide, europium oxide, samarium oxide and other materials such as described in U.S. Pat. No. 6,190,752 by Do et al. Preferably, the layer of oriented cubic oxide material having a rock-salt-like structure is a magnesium oxide (MgO) layer. Such a MgO layer is, preferably deposited by electron beam or ion beam evaporation with an ion beam assist. The MgO layer in the ion beam assisted deposition is typically evaporated from a crucible of magnesia. An ion-assisted, electron-beam evaporation system similar to that described by Wang et al., App. Phys. Lett., vol. 71, no. 20, pp. 2955–2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°.

The ion source gas in the ion beam assisted deposition is preferably argon. The ion beam assisted deposition of MgO is conducted with substrate temperatures of generally from about 20° C. to about 100° C. The MgO layer deposited by the IBAD process is generally from about 5 nm to about 20 nm in thickness, preferably about 8 nm to about 15 nm. After deposition of the oriented cubic oxide material having a rock-salt-like structure, e.g., MgO, an additional thin homoepitaxial layer of the same oriented cubic oxide material, e.g., MgO, can be optionally deposited by a process such as electron beam or magnetron sputter deposition. This thin layer can generally be about 40 nm to 100 nm in thickness. Deposition of the homo-epitaxial layer by such a process can be more readily accomplished than depositing the entire thickness by ion beam assisted deposition.

A thin film template structure is provided in accordance with the present invention and includes a substrate, one or more intermediate layers upon said substrate, a layer of an oriented cubic oxide material having a rock-salt-like structure upon the one or more intermediate layer, and a layer of strontium ruthenate upon the layer of an oriented cubic oxide material. The one or more intermediate layer can include a layer of an inert oxide material upon the surface of the substrate and a layer of an amorphous oxide or oxynitride material upon the inert oxide material layer. Alternatively, the one or more intermediate layer can be a layer of $Si_3N_4$ or a layer of an amorphous oxide or oxynitride material. Such a thin film template structure is useful for subsequent deposition of epitaxial thin films. Such epitaxial thin films can be formed from a material selected from the group consisting of superconductors, including high temperature superconductors, semiconductors, photovoltaic materials, magnetic or ferromagnetic materials, and precursors of superconductors or high temperature superconductors. The thin film template structure is especially preferred for subsequent deposition of high temperature superconductor materials. Depending upon the particular epitaxial thin film material deposited upon the thin film template structure, additional layers such as buffer layers can be employed for enhanced chemical or structural compatibility. In the case of YBCO as a high temperature superconductor, additional buffer layers are generally not required.

In one embodiment of the present invention, an intermediate layer of $SrRuO_3$ is deposited onto the MgO layer so that it is between the MgO layer deposited by the IBAD process or others such as e-beam evaporation or sputtering and the superconducting YBCO layer. The intermediate layer serves as a buffer layer between the MgO layer and the YBCO and assists in lattice matching. This so-called "buffer layer" should have good "structural compatibility" between the MgO or other oriented cubic oxide material deposited in the IBAD or other processes and the YBCO and should have good chemical compatibility with both adjacent layers. By "chemical compatibility" is meant that the intermediate layer does not undergo property-degrading chemical interactions with the adjacent layers. By "structural compatibility" is meant that the intermediate layer has a substantially similar lattice structure with the superconductive material so that the superconductive material can epitaxially grow on this intermediate layer. The layer of strontium ruthenate is generally from about 50 nm to about 1000 nm in thickness, preferably from about 100 nm to about 500 nm in thickness.

The strontium ruthenate layer is generally deposited at temperatures of greater than about 700° C., preferably at temperatures of from about 700° C. to about 850° C., more preferably from about 730° C. to about 780° C.

A high temperature superconducting (HTS) layer, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy, a trifluoroacetic acid process or a barium fluoride ($BaF_2$) process and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of up to 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 500 mTorr, preferably from about 100 mTorr to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam focused on the substrate surface can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

In one embodiment of the present invention illustrated in FIG. 1, a nickel alloy substrate is initially coated with a layer of aluminum oxide from about 80 nm to 100 nm in thickness deposited by masgnetron ion beam sputtering. The aluminum oxide layer is polished by chemical mechanical polishing to a smoothness of about 1 nm. Then, a layer of $Y_2O_3$ of from about 5 nm to about 20 nm in thickness is deposited on the aluminum oxide by pulsed laser deposition. Then, a layer of MgO (about 10 nm) is deposited on the yttrium oxide by ion beam assisted deposition. A homoepitaxial layer of MgO (not shown) is preferably deposited upon the IBAD-MgO layer, the homoepitaxial layer of MgO of about 40 nm in thickness deposited in a process such as electron beam or magnetron sputter deposition. Then, a buffer layer of $SrRuO_3$ of from about 50 nm to about 1000 nm in thickness is deposited on the MgO layer. Finally, a layer of YBCO is deposited, e.g., by pulsed laser deposition at a thickness of, e.g., about 1000 nm to 2000 nm.

The present invention is more particularly described in the following examples which are intended as illustrative only, since numerous modifications and variations will be apparent to those skilled in the art.

EXAMPLE A

On a nickel alloy substrate (Hastelloy C276), was deposited by magnetron sputter deposition a layer of aluminum oxide about 800 to about 1000 Angstroms in thickness. The substrates had been ultrasonically cleaned in soap and water, rinsed with deionized water, rinsed with methanol and blown dry with filtered nitrogen. The aluminum oxide layer was then polished by CMP (chemical-mechanical polishing) with a colloidal suspension of silica as the polishing medium. The resultant surface of the aluminum oxide had a smoothness (RMS roughness) of about 1 nm. Onto this resultant article was deposited a layer of $Y_2O_3$ (about 5 nm) by e-beam evaporation. Onto this resultant article was deposited a layer of MgO by ion-assisted, electron beam evaporation system similar to that of Wang et al., App. Phys. Lett., v. 71, no. 20, pp. 2955–2957 (1997). Onto the IBAD-MgO layer was then deposited a layer of homoepitaxial MgO by e-beam evaporation. The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr. The electron gun heated the MgO source to maintain a deposition rate of about 0.15 nm/sec. The ion-assist gun voltage and current density were about 750 eV and 100 $\mu A/cm^2$ respectively.

EXAMPLE 1

The following tests were then conducted using the intermediate article from Example A. $SrRuO_3$ (target from Superconductive Components, Inc. Columbus, Ohio) was deposited upon this homoepitaxial MgO/IBAD-MgO coated nickel-based alloy by pulsed laser deposition under the following typical conditions (system pressure of 200 mTorr oxygen, substrate temperature of 750° C., 5 pulses per second (pps), and 10 minutes deposition time). The sample was soaked in buffered HF for 30 mintes and then 30 mintes in deionized (DI) water. The substrate was coated with a high temperature superconducting layer of YBCO using the following conditions (200 mTorr oxygen, substrate temperature of 750° C., 8 pps, and 25 minutes) after the above treatment.

The following was then observed. The RMS values (about 3 nm or so from a 5×5 $\mu m^2$ scan area) of the $SrRuO_3$ film did not show any obvious change after the HF and DI water soakings. XRD analysis of the $SrRuO_3$ film showed clear $SrRuO_3$ diffraction peaks after the buffered HF and DI water soakings. XRD omega-rocking curve on (002) of $SrRuO_3$ had a FWHM of 3.4 degrees. XRD phi-scan on (132) of $SrRuO_3$ had a FWHM of between about 7.4 and 9.1 degrees.

The high temperature superconducting layer of YBCO (1.1 microns in thickness) deposited using the above conditions on buffered HF and DI water treated substrates had a Tc of 91 K and a transition width of 0.4 K. The critical current density of the film was 0.96 $MA/cm^2$ at 75.3 K. XRD omega-rocking curve on (005) of the high temperature superconducting film had a FWHM of 1.6 degrees. XRD phi-scan on (132) of the high temperature superconducting film had a FWHM of between about 4.6 and 6.2 degrees. These results clearly show that $SrRuO_3$ provides a good buffer layer even in the presence of HF. In other words, HF does not attack $SrRuO_3$ and $SrRuO_3$ does not degrade in the HF, water or water vapor environment.

EXAMPLE 2

A series of samples were prepared and tested for critical current density of the top superconducting layer. All samples included a nickel alloy substrate prepared as in example A. A total of 113 samples were prepared with an IBAD layer of MgO on the substrate, a homoepitaxial layer of MgO, a buffer layer of YSZ and either $CeO_2$ or $Y_2O_3$ on the MgO layer and a layer of YBCO (about 1 micron in thickness) on the layer of $CeO_2$ or $Y_2O_3$. Another set of 57 samples included an IBAD layer of MgO on the substrate, a homoepitaxial layer of MgO as in example 1, a buffer layer of $SrRuO_3$ on the homoepitaxial MgO layer and a layer of YBCO (about 1 micron in thickness) on the layer of $SrRuO_3$. The measured critical current densities from all the prepared samples were plotted and are shown in FIG. 2 as critical current density versus percentage of number of examples. These results showed that over 75 percent of the samples with the YSZ had a critical current density of at or below 0.2 $MA/cm^2$ while 100 percent of the samples with MgO and $SrRuO_3$ had a critical current density of above 0.2 $MA/cm^2$. From these results it was concluded that superconducting structures including the $SrRuO_3$ buffer layer had unexpectedly more consistent critical current density values than those samples based on a buffer layer of YSZ and either $CeO_2$ or $Y_2O_3$. Also, the median critical current density for the YSZ based samples was less than about 0.1 $MA/cm^2$ while the median critical current density for the $SrRuO_3$ based samples was about 0.7 $MA/cm^2$.

EXAMPLE 3

Following the procedure described in examples 1 and 2, a sample was prepared using the base substrate of nickel having the layers of $Al_2O_3$ and $Y_2O_3$ thereon. Onto that nickel based substrate substrate was sequentially deposited an IBAD layer of MgO, a homoepitaxial layer of MgO as in example 1, a buffer layer of $SrRuO_3$ on the homoepitaxial MgO layer and a layer of YBCO (about 1 micron in thickness) on the layer of $SrRuO_3$. The measured properties from this prepared sample included a Tc of 90.5K, a critical current density of 1.35 $MA/cm^2$ and an in-plane texture of 6.5 degrees.

Two samples were then prepared identically to that sample, but with the addition of a $CeO_2$ layer of from about 10 to 20 nanometers between the $SrRuO_3$ and the YB CO. The measured properties from these two samples included Tcs of 90.4K and 90.7K, critical current densities of 1.0 $MA/cm^2$ and 1.1 $MA/cm^2$ and in-plane textures of 6.9 degrees and 6.4 degrees. Thus, an intermediate layer of a material such as $CeO_2$ can be added between the $SrRuO_3$ and the YBCO and reasonable good properties can still be obtained.

EXAMPLE 4

An additional sample was then prepared, but with the addition of a $SrTiO_3$ layer of from about 10 to 20 nanometers between the $SrRuO_3$ and the YBCO. The measured properties from this samples included a Tc of 89.7K, a critical current density of 1.2 $MA/cm^2$ and an in-plane texture of 5.3 degrees. Thus, an intermediate layer of a material such as $SrTiO_3$ can be added between the $SrRuO_3$ and the YBCO and reasonable good properties can still be obtained.

Although the present invention has been described with reference to specific details, it is not intended that such details should be regarded as limitations upon the scope of the invention, except as and to the extent that they are included in the accompanying claims.

What is claimed is:

1. An article comprising:
   a substrate;
   at least one intermediate layer upon the surface of the substrate;
   a layer of an oriented cubic oxide material having a rock-salt-like structure upon the at least one intermediate layer; and, a layer of strontium ruthenate upon the layer of an oriented cubic oxide material having a rock-salt-like structure.

2. The article of claim 1 wherein said at least one intermediate layer comprises a layer of an inert oxide material upon the surface of the substrate and a layer of an amorphous oxide or oxynitride material upon the inert oxide material layer.

3. The article of claim 1 wherein said at least one intermediate layer comprises a layer of an amorphous oxide or oxynitride material upon the surface of the substrate.

4. The article of claim 1 further including a top-layer of a superconducting material upon the oriented cubic oxide material layer.

5. The article of claim 1 wherein said superconducting material is YBCO.

6. The article of claim 1 wherein the substrate is a flexible polycrystalline metal.

7. The article of claim 6 further including a top-layer of a superconducting material upon the strontium ruthenate layer.

8. The article of claim 1 wherein the layer of an oriented cubic oxide material having a rock-salt-like structure is deposited by ion beam assisted deposition.

9. The article of claim 8 further including a layer of homoepitaxial oriented cubic oxide material having a rock-salt-like structure between the ion beam assisted deposited cubic oxide material layer and the strontium ruthenate layer.

10. The article of claim 1 further including at least one layer of a buffer material upon the layer of strontium ruthenate.

11. The article of claim 10 wherein said at least one layer of a buffer material is of a material selected from the group consisting of cerium oxide and strontium titanate.

12. The article of claim 9 further including a top-layer of a superconducting material upon the layer of strontium ruthenate.

13. The article of claim 10 further including a top-layer of a superconducting material upon the at least one layer of buffer material.

14. The article of claim 11 further including a top-layer of a superconducting material upon the at least one layer of buffer material.

15. The article of claim 1 wherein the inert oxide material layer is a material selected from the group consisting of aluminum oxide, erbium oxide, and yttrium oxide.

16. The article of claim 1 wherein the amorphous oxide or oxynitride material layer is a material selected from the group consisting of yttrium oxide, aluminum oxynitride, erbium oxide, yttria-stabilized zirconia, cerium oxide and europium oxide.

17. The article of claim 1 wherein the oriented cubic oxide material layer is magnesium oxide.

18. The article of claim 1 wherein said strontium ruthenate further includes calcium.

19. A thin film template structure for subsequent epitaxial thin film deposition comprising:
  a flexible metal substrate;
  at least one intermediate layer upon the surface of the flexible metal substrate;
  a layer of an oriented cubic oxide material having a rock-salt-like structure upon the at least one intermediate layer; and,
  a layer of strontium ruthenate upon the layer of an oriented cubic oxide material having a rock-salt-like structure.

20. The thin film template structure of claim 19 wherein said at least one intermediate layer comprises a layer of an inert oxide material upon the surface of the polycrystalline flexible metal substrate and a layer of an amorphous oxide or oxynitride material upon the inert oxide material layer.

21. The thin film template structure of claim 19 wherein said at least one intermediate layer comprises a layer of an amorphous oxide or oxynitride material upon the surface of the substrate.

22. The thin film template structure of claim 19 wherein the inert oxide material layer is a material selected from the group consisting of aluminum oxide, yttrium oxide, and erbium oxide.

23. The thin film template structure of claim 19 wherein the amorphous oxide material layer is a material selected from the group consisting of yttrium oxide, aluminum oxynitride, erbium oxide, yttria-stabilized zirconia, cerium oxide and europium oxide.

24. The thin film template structure of claim 19 wherein the oriented cubic oxide material layer is magnesium oxide.

25. The thin film template structure of claim 19 wherein the inert oxide material layer is aluminum oxide, the amorphous oxide material layer is yttrium oxide and the oriented cubic oxide material layer is magnesium oxide.

26. The thin film template structure of claim 19 wherein said strontium ruthenate further includes calcium.

27. The thin film template structure of claim 19 further including at least one layer of a buffer material upon the layer of strontium ruthenate.

28. The thin film template structure of claim 27 wherein said at least one layer of a buffer material is of a material selected from the group consisting of cerium oxide and strontium titanate.

\* \* \* \* \*